United States Patent [19]

Chua et al.

[11] Patent Number: 4,654,830
[45] Date of Patent: Mar. 31, 1987

[54] METHOD AND STRUCTURE FOR DISABLING AND REPLACING DEFECTIVE MEMORY IN A PROM

[75] Inventors: H. T. Chua, Los Altos Hills; Cyrus Tsui, San Jose; Albert Chan; Gary Gouldsberry, both of San Jose, all of Calif.

[73] Assignee: Monolithic Memories, Inc., Santa Clara, Calif.

[21] Appl. No.: 675,379

[22] Filed: Nov. 27, 1984

[51] Int. Cl.<sup>4</sup> .............................................. G11C 13/00
[52] U.S. Cl. .................... 365/200; 365/210; 371/21
[58] Field of Search ............... 365/200, 210; 371/8, 371/10

[56] References Cited

U.S. PATENT DOCUMENTS

| | | | |
|---|---|---|---|
| 4,281,398 | 7/1981 | McKenny et al. | 365/210 |
| 4,291,394 | 9/1981 | Nakano et al. | 365/210 |
| 4,514,830 | 4/1985 | Hagiwarn et al. | 365/210 |
| 4,538,245 | 8/1985 | Smarandoiu et al. | 365/210 |

Primary Examiner—Terrell W. Fears
Attorney, Agent, or Firm—Alan H. MacPherson; Steven F. Caserza; Richard Franklin

[57] ABSTRACT

Means are provided for replacing a defective row (or column) of memory in a fuse-array PROM which comprises disabling the defective row and programming a redundant row to respond to the address of the defective row. Means are also provided for reducing the swing between high and low address voltages.

The redundant row is connected via an AND gate through fuses to all ADDRESS and $\overline{\text{ADDRESS}}$ lines of the address buffer, so that the redundant row is always off until programmed. If a defective row is found, all memory cells in the defective row are disabled and the redundant row is programmed by selectively blowing fuses leading to the ADDRESS and $\overline{\text{ADDRESS}}$ lines thus causing the redundant row to respond to the address of the defective row.

29 Claims, 4 Drawing Figures

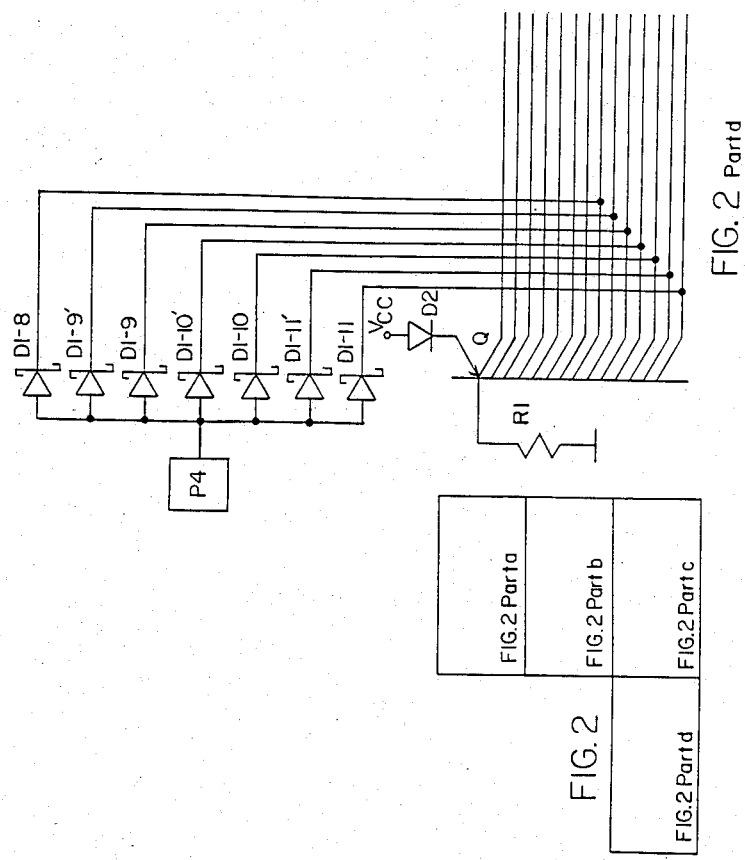
FIG. 2 Part d
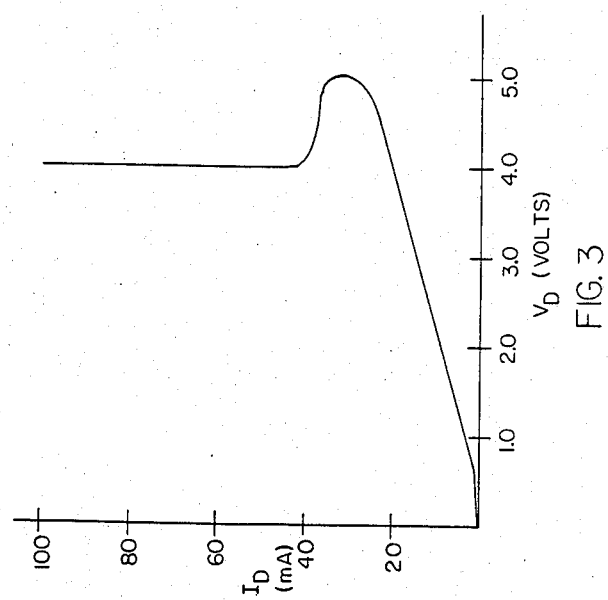
FIG. 3

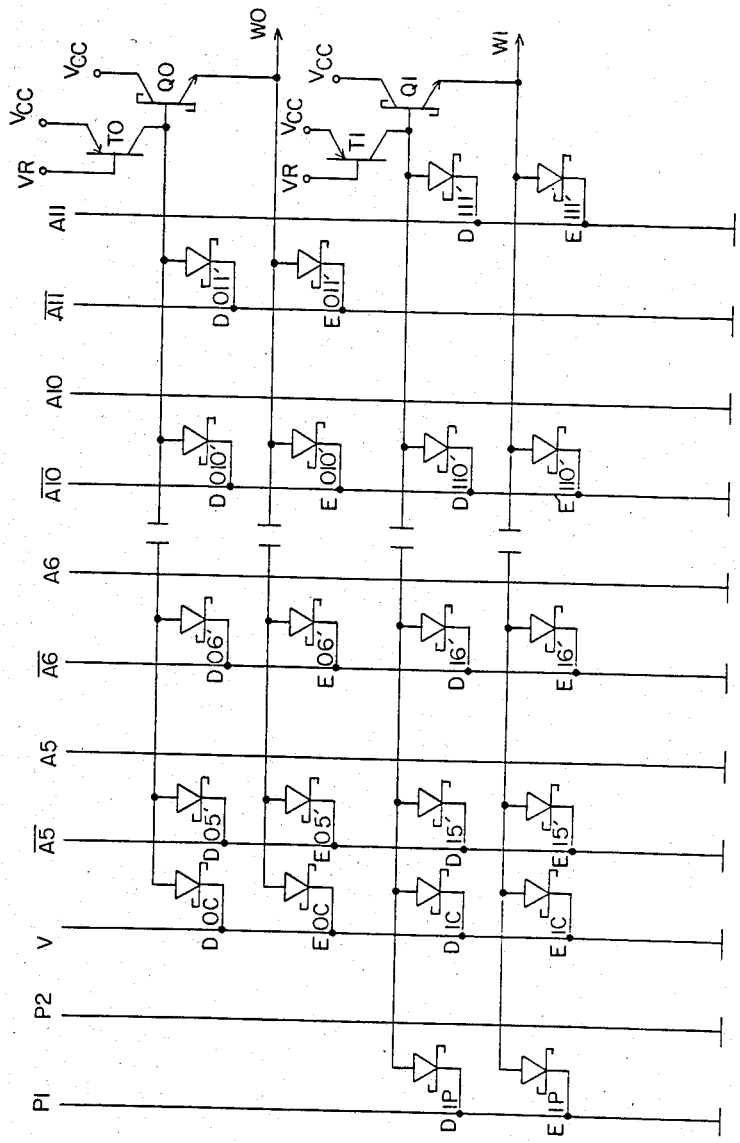
FIG 2 Part a

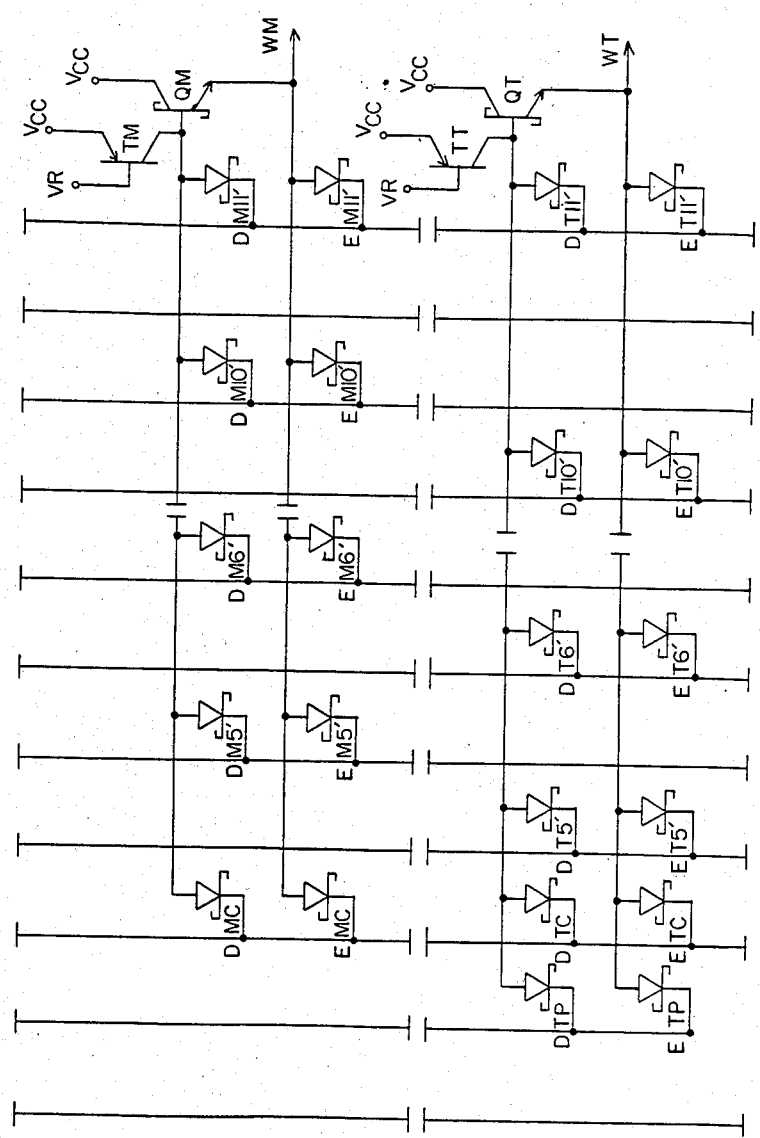
FIG. 2 Part b

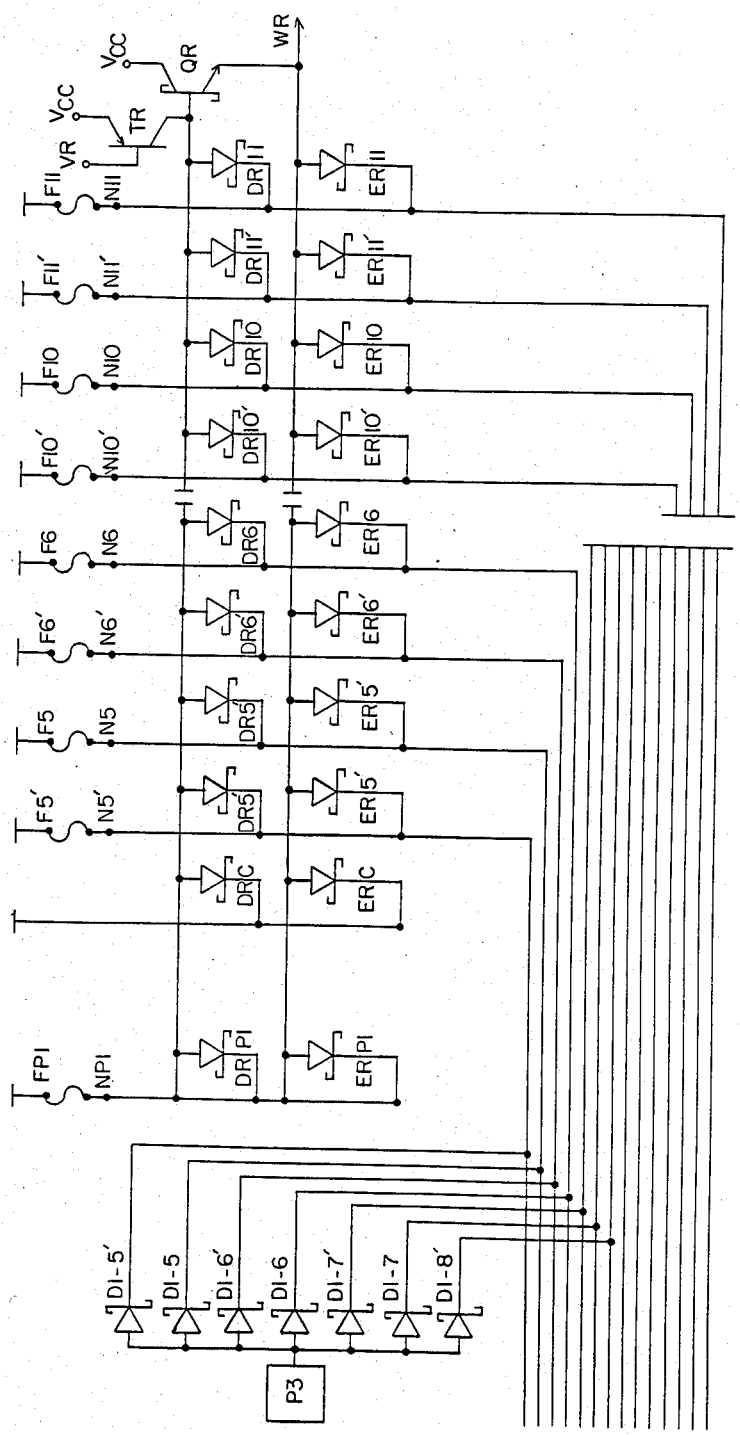
FIG. 2 Part c

METHOD AND STRUCTURE FOR DISABLING AND REPLACING DEFECTIVE MEMORY IN A PROM

BACKGROUND OF THE INVENTION

This invention relates to a semiconductor memory device, and more particularly to a semiconductor memory device including a redundant row or block of memory cells. It provides a method and structure for substituting a redundant row or block of memory cells for a faulty row or block.

Redundant memory cells are provided to increase the yield of memory devices. A redundant cell, row, or block of cells can be used to salvage devices having fewer than a specified number of defective cells, and thus increase yield. As memories become larger, the yield of perfect memory chips becomes lower, since having a larger number of cells on a silicon chip provides more opportunity for defective cells. Also, smaller size makes individual cells more fragile if there is not an accompanying increase in precision of cell fabrication. Programmable Read-Only Memory (PROM) devices are widely used in semiconductor applications. One type of PROM is programmed by opening fuses in selected memory cells. Fuse array PROMs are particularly susceptible to defects because the fuses are thin strands of metal and must have reliable characteristics such as width, thickness, and sheet resistivity so that they can be opened (blown) during programming but function reliably as a conducting wire if not opened.

Various methods for providing redundant memory are known in the art. Some circuits provide groups of individually addressable redundant memory cells, some provide single or multiple rows or columns of cells, and some provide blocks of memory cells and accompanying circuitry. Goldberg, in U.S. Pat. No. 3,995,261 describes a method for shifting the address of individual cells to avoid defective cells. Sumilas, et al., U.S. Pat. No. 3,753,244 stores in the integrated circuit the address of a defective row, and when the defective row is addressed uses a comparator to deselect the entire memory and select the redundant row. Sander, U.S. Pat. No. 3,654,610 provides a code converter, translating the address of a memory row to one of a series of possible intermediate codes which can be chosen to avoid locations of faulty cells. McKenny, U.S. Pat. No. 4,281,398, replaces an entire block of memory and the accompanying circuitry when the block is found defective.

Software is also used to replace units of defective memory with redundant memory. Choate, et al., in U.S. Pat. No. 4,047,163 describes a method which stores the row and column address of every defective cell and when a defective cell is addressed, the storage means generates signals which cause a corresponding cell in the redundant row or column to be selected in place of the defective cell.

Providing redundancy in memory devices requires extra circuitry and extra space on the device, and if gate delays result from the circuitry used to address redundant memory, providing such redundancy slows the operation of the device. It is an object of this invention to provide a redundant memory structure and method for disabling and replacing defective memory in a PROM such as a fuse array, which is programmed by open-circuiting memory cells. Another object is to provide sufficient redundancy to significantly increase yield without significantly slowing the operation of the circuit or increasing the size of the device.

SUMMARY

The structure and method of this invention provides redundant memory actuated by fuses or other programmable devices in the addressing portion of a PROM for which the memory cells are programmed by open circuiting a selected pattern of memory cells, for example, a fuse-array memory matrix.

In accordance with the teachings of this invention, if during testing no defects consisting of open circuited memory cells are found, the redundant row of memory is not activated. However, if one row or block in the memory matrix contains a cell or cells which are open circuited, that is, which do not carry current, the redundant row or block of memory is activated. The method of replacing the defective portion of memory consists of two steps; first, disabling the defective row or block of cells by addressing the row or block and disabling all memory cells in that row or block, for example by opening all fuses in the defective row or block; second, opening selected fuses in the portion of the circuit which addresses the redundant row or block, thus activating the redundant row or block and causing it to respond to the address of the defective row.

The addressing circuitry of the redundant row is programmed to respond to the combination of signals which address the defective row. The structure for addressing the rows of memory includes a pair of ADDRESS and $\overline{\text{ADDRESS}}$ lines for each bit of address information. One of each pair of lines is connected to circuitry which enables or disables a row of memory. If any of the connected lines is pulled low by a buffer which sends the address signals, the row is not activated. Different combinations of ADDRESS and $\overline{\text{ADDRESS}}$ lines are connected to successive rows, thus providing a different address for each row.

The redundant row differs from a primary row of memory in that each ADDRESS and $\overline{\text{ADDRESS}}$ line is connected through fuses or other programming means to circuitry which enables the redundant row. When all fuses are intact the redundant row is never activated since half of the ADDRESS and $\overline{\text{ADDRESS}}$ lines are low for any row address. By opening fuses connected to selected ADDRESS and $\overline{\text{ADDRESS}}$ lines, the redundant row is programmed to respond to the address of the defective row.

Also connected to the ADDRESS and $\overline{\text{ADDRESS}}$ lines are a voltage pull-up means and a clamping means which, during normal operation of the circuit by the user, decreases voltage swing during address changes, thus increasing switching speed.

Among the advantages of this invention are that since activating and establishing the address of the redundant row can be done at wafer sort (i.e., when the integrated circuits are inspected before the individual integrated circuit memory device is packaged, there is no danger of misactivating the redundant row by the user; in fact there is no need for the user to have familiarity with the redundant row activating circuitry. Also, the memory chip can remain small due to the small area occupied by the redundant circuitry. Switching time during operation is fast, due to the voltage pull-up transistor and clamp line which reduce voltage swing, and therefore the circuit of this invention is not significantly slower

BRIEF DESCRIPTION OF THE DRAWINGS

FIG. 2 is a schematic diagram of a row addressing circuit constructed in accordance with one embodiment of this invention, showing three of the word lines, the redundant word line, and the test word line.

FIG. 3 is a graph which depicts the latchback effect in Schottky diodes.

DETAILED DESCRIPTION

Figure 1A:
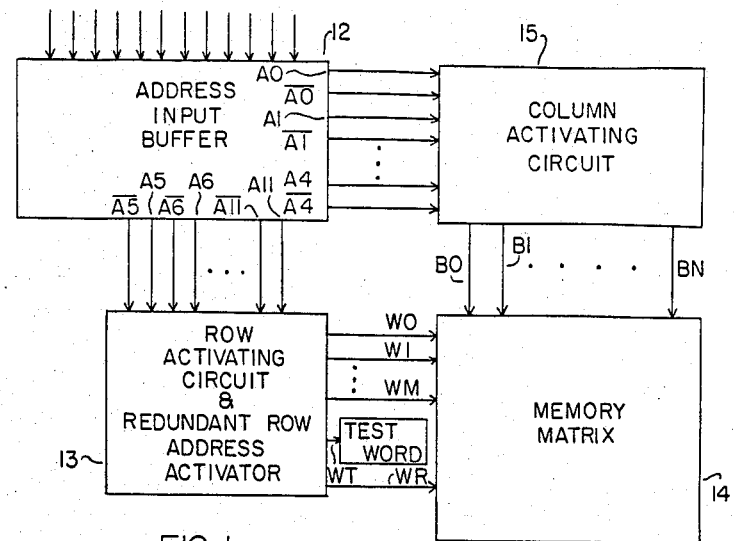
FIG. 1a is a block diagram of a PROM constructed in accordance with one embodiment of this invention.

FIG. 1a shows one embodiment of a memory circuit constructed in accordance with the teachings of this invention which includes address input buffer 12, column addressing or activating circuitry 15, row addressing or activating circuitry 13, and memory matrix 14 containing a plurality of rows and a plurality of columns with a memory cell at the intersection of each row and column. Each memory cell is capable of storing a single binary digit ("bit") of information, and each row (often referred to as a "word line") stores a "word" formed of a plurality of bits. The embodiment of FIG. 1a has 128 word lines in the memory and 256 memory cells in each word line (thus 256 columns). Other embodiments would be obvious to those skilled in the art, for example having memory cells within a block divided into rows.

Figure 1B:
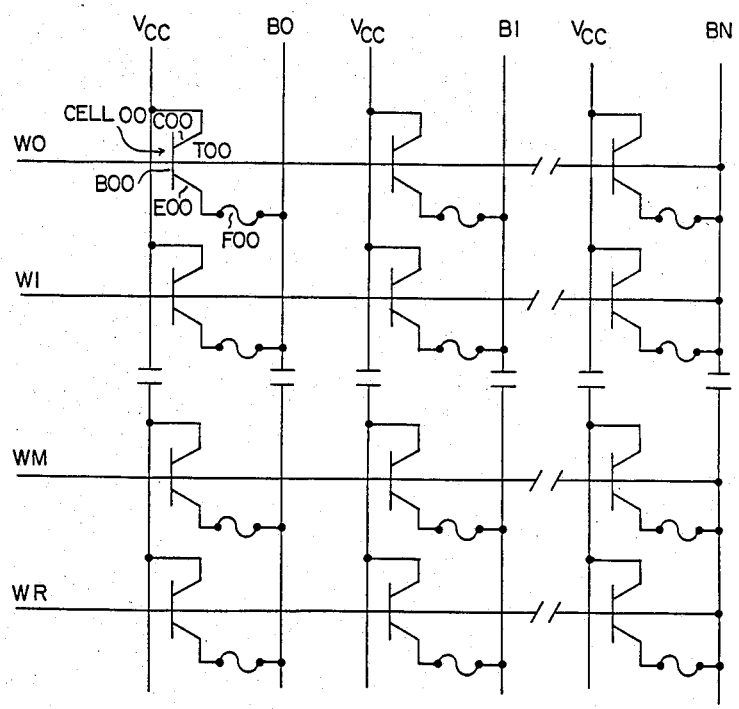
FIG. 1b is a schematic diagram of the circuitry of a PROM memory matrix constructed in accordance with one embodiment of this invention.

FIG. 1b is a schematic diagram of one embodiment of PROM memory matrix 14 of FIG. 1a. Memory matrix 14 includes bit lines $B_0$ through $B_N$ and word lines $W_0$ through $W_M$, and redundant word line $W_R$. Coinciding with each combination of word line and bit line is a memory cell. Each memory cell includes a transistor and a fuse, for example, in cell 00 having transistor T00 and fuse F00, base B00 of transistor T00 is connected to word line W0, collector C00 is connected to positive voltage source $V_{cc}$, and emitter E00 is connected through fuse F00 to bit line B0.

Address buffer 12 (FIG. 1a) provides addressing information to memory row addressing decoder circuitry 13 in order to select the row defined by the address signals provided by address buffer 12, and deselecting all other rows. To address $2^K$ words requires K bits of address information. This information is provided on K pairs of complementary lines called ADDRESS and $\overline{\text{ADDRESS}}$ lines. Address buffer 12 has seven ADDRESS lines A5 through A11 and seven $\overline{\text{ADDRESS}}$ lines $\overline{\text{A5}}$ through $\overline{\text{A11}}$ leading to row address circuitry 13 and thus can address $2^7$ or 128 word lines. Similarly, buffer 12 addresses columns activating circuit 15.

FIG. 2 is a schematic diagram of one embodiment of row address circuitry 13 of FIG. 1a constructed in accordance with this invention. In FIG. 2, each word line, for example W0, receives pull-up voltage $V_{cc}$ (typically 5 volts), through NPN transistor Q0 (the word line driver) having its emitter connected to word line W0, its collector connected to positive voltage supply line $V_{cc}$, and its base connected to the collector of PNP transistor T0 which has its emitter connected to positive voltage supply line $V_{cc}$ and its base connected to regulated voltage supply line VR which serves to control current through transistor T0 to the base of transistor Q0, and thus the current through transistor Q0 to word line W0. In addition, the base of transistor Q0 is also connected to diodes D05' through D011', having their anodes connected to the base of driver transistor Q0 and their cathodes connected to a respective $\overline{\text{ADDRESS}}$ lines $\overline{\text{A5}}$ through $\overline{\text{A11}}$. Diodes E05' through E011' have their anodes connected to word line W0 and their cathodes connected to a respective $\overline{\text{ADDRESS}}$ line, $\overline{\text{A5}}'$ through $\overline{\text{A11}}'$. Diodes D05' through D011' and E05' through E011' control the operation of word line W0. None are connected to ADDRESS lines A5 through A11. If any one of diodes D05' through D011' is turned on by the $\overline{\text{ADDRESS}}$ line to which it is connected, the base of word line driver transistor Q0 is pulled low and transistor Q0 turns OFF. As shown in FIG. 2, the $\overline{\text{ADDRESS}}$ line which turns on one of diodes D05' through D011' also turns on one of diodes E05' through E011' and thus pulls word line W0 low, deselecting that word in memory matrix 14 (FIG. 1a).

When address buffer 12 (FIG. 1a) sends low signals on all ADDRESS lines and thus high signals on all $\overline{\text{ADDRESS}}$ lines, word line W0 is pulled high by transistor Q0, and is not pulled low by any diodes E05' through E011', and thus word line W0 is selected and the bits stored in the memory cells located on word line W0 can be addressed by applying appropriate signals to bit lines B0 through B256 (FIG. 1b). Only the selected word line W0 responds to addressing signals on bit lines B0 through B256.

When word line W0 is selected, as in the example here, word line W1, also shown in FIG. 2, is not selected because word line W1 has diode E111 connected to the A11 ADDRESS line, which is pulled low by the signal from address buffer 12. Likewise, the remaining word lines W3 through WM are pulled low, since each remaining word line has at least one diode connected to an ADDRESS line, and thus all remaining word lines are deselected. As is well known to those of ordinary skill in the art, by providing a different pattern of diodes connected from each word line W0 through WM and each word line pull-up transistors Q0 through QM to the ADDRESS and $\overline{\text{ADDRESS}}$ lines, each word line is addressed by applying a different combination of signals to the seven pairs of ADDRESS lines A5 through A11 and $\overline{\text{ADDRESS}}$ lines $\overline{\text{A5}}$ through $\overline{\text{A11}}$.

Row activating circuit 13 also contains redundant word line WR. Diodes ER5' through ER11' and ER5 through ER11 have their anodes connected to redundant word line WR. Diodes DR5' through DR11' and DR5 through DR11 have their anodes connected to the base of redundant word line driver transistor QR. The cathodes of diodes DR5' through DR11' are connected to nodes N5' through N11', respectively, the cathodes of diodes DR5 through DR11 are connected to nodes N5 through N11, respectively, the cathodes of diodes ER5' through ER11' are connected to nodes N5' through N11', respectively, and the cathodes of diodes ER5 through ER11 are connected to nodes N5 through N11, respectively. Nodes N5' through N11' are connected to fuses F5' through F11', respectively. Nodes N5 through N11 are connected to fuses F5 through F11, respectively. Fuses F5' through F11' are connected to $\overline{\text{ADDRESS}}$ lines $\overline{\text{A5}}$ through $\overline{\text{A11}}$, respectively, and fuses F5 through F11 are connected to ADDRESS lines A5 through A11, respectively.

After a memory device is manufactured, each row of memory is tested for defects. To do this, each row is sequentially selected by addressing circuit 13, as described above, and each memory cell in the selected row is tested to determine if it carries the expected current (i.e., if the fuse for that memory cell is intact). All memory cells are thus tested.

If the memory matrix is found during testing to have no defective rows, fuses F5' through F11' and F5 through F11 are left intact and the redundant word line is always deselected, since half of its addressing diodes pull the redundant word line WR low for any given set of ADDRESS and $\overline{\text{ADDRESS}}$ signals. If a defect is detected in one word line during wafer testing (and before packaging in this embodiment), the redundant row is programmed to respond to the address of the defective row. Before programming the address for the redundant word line, the entire defective word line, for example W0, is disabled. This is done by selecting the defective word line W0 and applying high voltage WRITE signals (typically 12 volts) on bit lines B0 through BN (FIG. 1b) to every cell in defective word line W0, thus opening the fuses in all memory cells of the defective word line.

Next, row activating circuit 13 is programmed such that redundant word line WR is selected in response to the address of the defective word line. To program the redundant word line addressing circuitry with the address of the defective word line, memory matrix 14 is disabled by raising the voltage on the bit lines B0 through BN and on $V_{cc}$ as shown in FIG. 1b in order to protect memory matrix 14 from the high voltage signal used to program row activating circuit 13. The address of the defective word line is again sent to row addressing circuitry 13. In the example where word line W0 is defective, all ADDRESS lines A5 through A11 are at a low voltage, typically 0.3 V, and all $\overline{\text{ADDRESS}}$ lines $\overline{\text{A5}}$ through $\overline{\text{A11}}$ are at a high voltage, typically 9 volts. The positive voltage supply (not shown) serving address buffer 12 is raised to a voltage greater than $V_{cc}$ used to power the device during operation (for example 9 volts when $V_{cc}$ is normally 5 volts), in order to allow the circuitry in address buffer 12 to carry the large current needed for opening fuses. While the address of defective word line W0 is still selected, a yet higher voltage, for example 11 volts, is applied for a short time, 50 microseconds in this embodiment, first to redundant row programming pad P3 (FIG. 2) and then to redundant row programming pad P4 (FIG. 2). Programming pads P3 and P4 are connected to the anodes of diodes D1-5' through D1-11' and D1-5 through D1-11 which have their cathodes connected to nodes N5' through N11' and N5 through N11, respectively, which are connected through fuses to respective ADDRESS and $\overline{\text{ADDRESS}}$ lines. In one embodiment, pads P3 and P4 are pads to which probes can be attached during the wafer sort operation. In the case of defective word line W0, the high voltage applied first to pad P3 and then to pad P4 causes a large voltage drop across fuses F5 through F11 leading to low voltage level ADDRESS lines A5 through A11, nearly 11 volts in this embodiment, thereby causing fuses F5 through F11 to open. Furthermore, in the case of defective word line W0, the high voltage applied to pads P3 and P4 causes a much lower voltage, less than 6 volts, across fuses F5' through F11' leading to the high $\overline{\text{ADDRESS}}$ lines $\overline{\text{A5}}$ through $\overline{\text{A11}}$, thereby not causing fuses F5' through F11' to open. Pads P3 and P4 are activated with the high voltage individually according to this embodiment, in order to limit the amount of current which must be sunk by a current sinking transistor (not shown) in input buffer 12 while opening fuses in the redundant row addressing circuitry. Of course other numbers of programming pads could be used in accordance with the teachings of this invention, depending on the needs of the particular circuit. In one embodiment the pads are made accessible for use after packaging the memory device. In accordance with the teachings of this invention, a different combination of fuses F5 through F11 and F5' through F11' will be opened depending on which word line W0 through WM is defective.

In accordance with the Schottky response curve shown in FIG. 3, for the same example of a defective word line W0, fuses F5 through F11 to the low voltage level ADDRESS lines A5 through A11 are opened by the high current and fuses F5' through F11' to the high $\overline{\text{ADDRESS}}$ lines $\overline{\text{A5}}$ through $\overline{\text{A11}}$ remain intact. Thus redundant word line WR is programmed to have the same pattern of diodes connected to ADDRESS and $\overline{\text{ADDRESS}}$ lines as word line W0 has. Therefore, redundant row WR is activated when word line W0 is addressed.

In order to reduce the effect of capacitance presented to the circuit by this redundant word addressing circuitry, including all diodes connected to word line WR and to pull-up transistor QR, PNP transistor Q of FIG. 2 has multiple collectors attached to all nodes N5' through N11' and N5 through N11, its base provided with a path to ground through a resistive means R1 and its emitter connected through a voltage dropping diode D2 to positive voltage supply $V_{cc}$. Transistor Q causes a reduced voltage swing between high and low signals from address buffer 12, and thus increases switching speed, as there is reduced capacitive current needed to change the voltage level of the redundant word circuitry and the main addressing circuitry before switching is completed.

Address buffer 12 (FIG. 1a) must also be tested for defects. To provide for this, test word line WT is provided, as indicated in FIG. 2, and the addressing circuitry for test word line WT has an extra set of diode connections to one of each pair of ADDRESS and $\overline{\text{ADDRESS}}$ lines, this set of connections having the same address (combination of connections to ADDRESS and $\overline{\text{ADDRESS}}$ lines) as one of the words in the memory matrix, word line W1 in the embodiment shown in FIG. 2. In order to distinguish the test word line WT from the memory word line W1 having the same address, an extra pair of ADDRESS lines P1 and P2 is included in the addressing portion of the memory device. A pair of diodes DTP and ETP from ADDRESS line P2 are connected to word line WT and pull-up transistor QT of the test word line. A pair of diodes D1P, E1P from address line P1 are connected to word line W1 and driver transistor Q1 of the word line W1. Pairs of diodes DRP1, and ERP1, are connected from ADDRESS line P1 to redundant word line WR and its pull-up transistor QR. By this method it is possible to test the operation of the address buffer during the inspection phase, since the test word line WT can be accessed, programmed, and read to insure proper operation. Since the test word line is covered during packaging (in this embodiment), it is generally not available to the end user, and the test data programmed therein does not affect the end user.

It can be seen that the redundant row circuitry of this invention results in negligible decrease in speed of the circuit compared to a circuit not employing the redundancy feature of this invention. If the redundancy programming pads are not accessible after packaging, the benefit of higher yield and therefore lower cost is provided to the user without the necessity of the user understanding the redundant circuit operation. Due to transistor Q, the speed of a circuit of this invention is very fast. The ability to replace a single row is enough to significantly increase yield of memory devices for many applications.

Another embodiment of this invention provides a redundant column, replacing a defective column of cells with the redundant column, the redundant column activated by a means very similar to that already described for replacing a defective row with a redundant row. The difference is that where FIG. 2 shows a constant voltage $V_{cc}$ being applied to the collectors of driver transistors Q0, Q1, ... QM and QR, in the case of a redundant column the voltage applied to the driver transistors of the bit lines leading to the columns of memory is a READ voltage if a memory cell in that column is to be read and a WRITE voltage if a fuse in that column is to be opened. Of course, it will become readily apparent to one of ordinary skill in the art in light of the teachings of this specification that a single device could employ both a redundant row and a redundant column of memory.

A further embodiment provides a redundant column set for a memory in which a column set includes not one memory cell per word line but one byte, or group of memory cells to be read or written to simultaneously, typically 4 to 32 memory cells per word line. When a column set is addressed, the 4 to 32 bit lines which READ or WRITE a memory cell are activated, a common structure employed in computer design. In this embodiment a redundant column set would likewise have 4 to 32 bits for each word line so that if a column set is found to contain defective bits, the column set of memory is deactivated by the method previously described and the redundant column set is programmed by the method previously described to respond to the address of the defective column set.

The method of this invention could also provide for a redundant block of memory, in fact any unit of memory addressed by ADDRESS and $\overline{\text{ADDRESS}}$ lines. We will use the term "unit" to refer to a "row," a "column," a "column set," "both a row and a column," or "both a row and a column set" of memory cells.

Thus the redundancy method of the invention can be used to significantly increase yield by restoring marginally defective devices through a redundant circuit design that is simple to construct, small in physical size and fast during normal operation.

While this specification and the accompanying figures illustrate specific embodiments of this invention, they are not to be interpreted as limiting the scope of the invention. Many embodiments of this invention will become evident to those of ordinary skill in the art in light of the teachings of this specification.

We claim:
1. A programmable read-only memory device comprising:
   a memory matrix having orginal programmable memory cells grouped into rows and columns or column sets and having a redundant row of programmable memory cells;
   an address buffer having means for receiving address input signals, and means for sending complementary address signals via pairs of ADDRESS and $\overline{\text{ADDRESS}}$ lines;
   a row activating circuit having means for receiving some of said complementary address signals and in response to said signals activating via a word line one of said rows in said memory matrix;
   a column or column set activating circuit having means for receiving the remainder of said complementary address signals, and in response to said remainder of signals, sending via a bit line or via bit lines a READ or WRITE signal to one of said columns or column sets in said memory matrix;
   means for programming each memory cell in a defective one of said rows of said original memory cells to a state such that when said defective row and said redundant row are addressed simultaneously said redundant row can be read; and
   means for configuring said row activating circuit so that said redundant row of memory cells is activated via a redundant row word line in response to complementary address signals intended for activating said defective one of said rows of said original memory cells in said memory matrix.

2. A programmable read-only memory device as in claim 1 where each of said memory cells comprises a transistor and a fuse, said transistor having a first current carrying terminal connected to a voltage supply line, a control terminal connected to one of said word lines and a second current carrying terminal connected through said fuse to one of said bit lines.

3. A programmable read-only memory devices as in claim 2 where said means for sending complimentary address signals from said address buffer to said row activating circuit comprises K pairs of ADDRESS and $\overline{\text{ADDRESS}}$ signal lines where to $2^K$ is no less than the number of rows in said memory matrix and where said means for sending complementary address signals from said address buffer to said column or column set activating circuit comprises L pairs of ADDRESS and $\overline{\text{ADDRESS}}$ signal lines where $2^L$ is no less than the number of columns or column sets in said memory matrix.

4. A programmable read-only memory device as in claim 3, where said row activating circuit comprises
   for each of said word lines, means for connecting one of each pair of said K pairs of signal lines through a diode to said word line, and through a diode to the base of a driver transistor which has its first current carrying terminal connected to a first voltage supply, its second current carrying terminal connected to said word line and its spaced further connected to a regulated voltage supply,
   the combinations of K ADDRESS signal lines and $\overline{\text{ADDRESS}}$ signal lines which are attached to each of said word lines and their corresponding word line driver transistors chosen so they will distinguish said $2^K$ word lines.

5. A programmable read-only memory device as in claim 4 where said diodes comprise Schottky diodes.

6. A programmable read-only memory device as in claim 5 where said row activating circuit further comprises a clamp line connected from a clamping voltage source to said bases of said driver transistors and to said word lines.

7. A programmable read-only memory device as in claim 2 where said bit lines can send a READ voltage to said memory cells in order to test the states of said memory cells, and can send a WRITE voltage to said memory cells in order to open said fuses in said memory cells, and thus can be used to disable a defective row in preparation for assigning the address of said defective row to said redundant row.

8. A programmable read-only memory device as in claim 1 in which said means for programming each said memory cell in a defective row comprises means for activating a word line corresponding to said defective row and means for sending on each of said bit lines said WRITE voltage.

9. A programmable read-only memory device as in claim 8 where said means of configuring said row activating circuit comprises
- 2K redundant row programming fuses connected from each line of the pair of said K ADDRESS signal lines and K $\overline{\text{ADDRESS}}$ signal lines to each of 2K nodes,
- each of said 2K nodes connected through diodes to said word line of said redundant row,
- each of said 2K nodes also connected through diodes to the base of a redundant word line driver transistor which has
- its first current carrying terminal connected to said first voltage supply, its second current carrying terminal connected to said redundant word line, and its base further connected to said regulated voltage supply,
- each of said 2K nodes further connected to the first current carrying terminal of a multiple-first-terminal transistor which has its second current carrying terminal connected through means for altering voltage level to said first voltage supply and its base connected through a resistive means to a second voltage supply, and
- each of said 2K nodes being connected through diodes to at least one redundant row programming pad.

10. A programmable read-only memory device as in claim 9 wherein said means for configuring said redundant column or column set activating circuit comprises
- 2L redundant column or column set programming fuses connected from each of the pair of said L ADDRESS and $\overline{\text{ADDRESS}}$ signal lines to each of 2L nodes,
- each of said 2L nodes connected through diodes to each of said bit lines of said redundant column or column set, each of said 2L nodes also connected through diodes to the bases of one redundant bit line driver transistor for each of said bit lines of said redundant column or column set,
- each said redundant bit line driver transistor having its first current carrying terminal connected to a source which can supply said WRITE voltage, its second current carrying terminal connected to its respective redundant bit line, and its base connected to a regulated voltage supply,
- each of said 2L nodes further connected to the first current carrying terminal of a multiple-first-terminal transistor which has its second current carrying terminal connected through means for altering voltage level to said first voltage supply and its base connected through a resistive means to a second voltage supply, and
- each of said 2L nodes being connected through diodes to at least one redundant column or column set programming pad.

11. A programmable read-only memory device as in claim 9 where said means for altering voltage level and said diodes comprise Schottky diodes.

12. A programmable read-only memory device as in claim 10 where said means for altering voltage level and said diodes comprise Schottky diodes.

13. A programmable read-only memory device as in claim 1 including means for testing said address buffer where said means for testing includes a test word activating circuit and a test word having the same address as does one of the word lines in the memory matrix, said one of the word lines and said test word each having an address line which distinguishes the test word from the word line having the same address, said redundant row being connected to the address line of said one of the word lines having the same address as said test word.

14. A programmable read-only memory device as in claim 13 where said test word activating circuit comprises a first test line connected from a test pad through a diode to said test word, and through a diode to the base of a driver-transistor of said test word; and a second test line connected from a different test pad through a diode to said word line having the same address as said test word, through a diode to the base of a driver-transistor of said word line having the same address as said test word, through a diode to said redundant row and through a diode to the base of a driver-transistor of said redundant row.

15. A programmable read-only memory device as in claim 1 having means for reducing voltage swing between high and low signals to input terminals of an AND-GATE circuit, comprising a pull-up transistor (Q) having
- a first current carrying terminal connected through a voltage shifting means to a first voltage supply line,
- a control terminal connected through a resistive means to a second voltage supply line, and
- multiple second current carrying terminals connected to all said ADDRESS and $\overline{\text{ADDRESS}}$ lines.

16. A programmable read-only memory device as in claim 15 where said voltage shifting means is a diode.

17. In a programmable read-only memory having original programmable units of memory and a redundant programmable unit of memory, a method of replacing a defective one of said original programmable units of programmable read-only memory with said redundant unit comprising:
- detecting the presence of said defective unit of memory;
- programming each memory cell in said defective unit of memory to a state such that when said defective unit and said redundant unit are addressed simultaneously said redundant unit can be read; and
- selectively disconnecting leads from complementary address lines to said redundant unit of memory so that said redundant unit of memory responds to the address of said defective unit.

18. A method of replacing a defective unit of programmable read-only memory as in claim 17, each said memory cell comprising a transistor and a fuse, where said step of detecting the presence of said defective unit of memory comprises:
- raising the voltage on the control terminal of each said transistor in each successive unit of memory cells and while said voltage on said control terminal is raised,
- applying a low voltage across current carrying terminals of each cell having a raised voltage on the control terminal of its transistor, and
- determining from the value of current carried by the cell whether the cell is in fact defective, and if any cell in said unit of memory is defective, determining thereby that said unit of memory is defective.

19. A method of replacing a defective unit of programmable read-only memory as in claim 17 where said step of programming each memory cell in said defective unit comprises:
for each cell in said defective unit, raising the voltage on a word line connected to said cell, each cell having a fuse, and passing a high current through said cell, thereby opening said fuse.

20. A method of replacing a defective unit of programmable read-only memory as in claim 17 where said step of selectively disconnecting leads from complementary address lines to a redundant unit of memory comprises:
holding at a high voltage ADDRESS lines corresponding to the address of said defective unit;
holding at a low voltage $\overline{\text{ADDRESS}}$ lines not corresponding to the address of said defective unit;
holding at a low voltage ADDRESS lines corresponding to the address of said defective unit;
holding at a high voltage $\overline{\text{ADDRESS}}$ lines not corresponding to the address of said defective unit;
bringing, in succession, at least one redundant row programming pad which is connected to a plurality of voltage shifting and electrical isolating means which are each in turn connected through a fuse to one of said ADDRESS and $\overline{\text{ADDRESS}}$ lines to a voltage
high enough to cause current flowing through fuses which lead to said ADDRESS and $\overline{\text{ADDRESS}}$ lines held at a low voltage to be opened, and
not high enough to cause current flowing through fuses which lead to said ADDRESS and $\overline{\text{ADDRESS}}$ lines held at a high voltage to be opened;
so that said voltage high enough is eventually applied through fuses to all of said ADDRESS and $\overline{\text{ADDRESS}}$ lines.

21. A programmable read-only memory device comprising:
a memory matrix having original programmable memory cells grouped into rows and columns or column sets and having a redundant column or column set of programmable memory cells;
an address buffer having means for receiving address input signals, and means for sending complementary address signals via pair ADDRESS and $\overline{\text{ADDRESS}}$ lines;
a row activating circuit having means for receiving some of said complementary address signals and in response to said signals activating via a word line one of said rows in said memory matrix;
a column or column set activating circuit having means for receiving the remainder of said complementary address signals, and in response to said remainder of signals, sending via a bit line or via bit lines a READ or WRITE signal to one of said columns or column sets in said memory matrix;
means for programming each memory cell in a defective one of said columns or column sets of said original memory cells to a state such that when said defective column or column set and said redundant column or column set are addressed simultaneously said redundant column or column set can be read; and
means for configuring said column or column set activating circuit so that said redundant column or column set of memory cells is activated via a redundant column or column set word line in response to complementary address signals intended for activating said defective column or column set of said original memory cells in said memory matrix.

22. A programmable read-only memory device as in claim 21, where each of said memory cells comprises a transistor and a fuse, said transistor having a first current carrying terminal connected to a voltage supply line, a control terminal connected to one of said word lines and a second current carrying terminal connected through said fuse to one of said bit lines.

23. A programmable read-only memory device as in claim 21, wherein said means for sending complementary address signals from said address buffer to said row activating circuit comprises K pairs of ADDRESS and $\overline{\text{ADDRESS}}$ signal lines where $2^K$ is no less than the number of rows in said memory matrix and where said means for sending complementary addressing signals from said address buffer to said column or column set activating circuit comprises L pairs of ADDRESS and $\overline{\text{ADDRESS}}$ signal lines where $2^L$ is no less than the number of columns or column sets in said memory matrix.

24. A programmable read-only memory device as in claim 23 where said row activating circuit comprises:
for each of said word lines, means for connecting one of each pair of said K pairs of signal lines through a diode to said word line, and through a diode to the base of a driver transistor which has its first current carrying terminal connected to a first voltage supply, its second current carrying terminal connected to said word line and its base further connected to a regulated voltage supply,
the combinations of K ADDRESS signal lines and $\overline{\text{ADDRESS}}$ signal lines which are attached to each of said word lines and their corresponding word line driver transistors chosen so they will distinguish said $2^K$ word lines.

25. A programmable read-only memory device as in claim 24 where said diodes comprises Schottky diodes.

26. A programmable read-only memory device as in claim 24 where said row activating circuit further comprises a clamp line connected from a clamping voltage source to said bases of said driver transistors and to said word lines.

27. A programmable read-only memory device as in claim 21 where said bit lines can send a READ voltage to said memory cells in order to test the states of said memory cells, and can send a WRITE voltage to said memory cells in order to open said fuses in said memory cells, and thus can be used to disable a defective column or column set in preparation for assigning the address of said defective column or column set to said redundant column or column set.

28. A programmable read-only memory device as in claim 21 in which said means for programming each memory cell in a defective one of said columns or column sets of said original memory cells comprises means for activating word lines corresponding to said defective one of said columns or column sets and means for sending on said bit line corresponding to said defective column or column set said WRITE voltage to all memory cells in said defective column or column set.

29. A programmable read-only memory device as in claim 4 where said means for configuring said row activating circuit so that said redundant row of memory cells is activated comprises means for disconnecting a selected one of each of said K pairs of signal lines from said redundant row word line such that said redundant row responds to an address for said defective one of said rows.

* * * * *

UNITED STATES PATENT AND TRADEMARK OFFICE
CERTIFICATE OF CORRECTION

PATENT NO. : 4,654,830

DATED : March 31, 1987

INVENTOR(S) : H. T. Chua, Cyrus Tsui, Albert Chan and Gary Gouldsberry

It is certified that error appears in the above-identified patent and that said Letters Patent is hereby corrected as shown below:

Column 4, line 6, "lines" should read --line--.

Column 9, line 10, "claim 8" should read --claim 29--.

Column 9, line 38, "claim 9 wherein" should read ---claim 24 where--

Signed and Sealed this

Twenty-fifth Day of August, 1987

Attest:

DONALD J. QUIGG

Attesting Officer

Commissioner of Patents and Trademarks